United States Patent [19]
Baxter et al.

[11] Patent Number: 5,926,696
[45] Date of Patent: Jul. 20, 1999

[54] BALL GRID ARRAY PLASTIC PACKAGE

[75] Inventors: George Addis Baxter, Hellertown, Pa.; Charles Cohn, Wayne, N.J.; Theodore Joseph Sattler, Easton, Pa.; Lakshmendra S. Saxena, Bridgewater, N.J.

[73] Assignee: Lucent Technologies Inc., Murray Hill, N.J.

[21] Appl. No.: 08/655,509

[22] Filed: May 30, 1996

Related U.S. Application Data

[62] Division of application No. 08/180,248, Jan. 12, 1994, abandoned.

[51] Int. Cl.⁶ .......................... H01L 21/44; H01L 23/053; H01L 23/48; H01L 23/28
[52] U.S. Cl. .......................... 438/118; 438/125; 438/126; 438/127; 257/700; 257/701; 257/780; 257/787
[58] Field of Search .................................... 437/217, 220, 437/219, 211, 215; 438/118, 125, 126, 127; 257/700, 701, 780, 787; 361/718, 764, 807

[56] References Cited

U.S. PATENT DOCUMENTS

| | | | |
|---|---|---|---|
| 4,086,696 | 5/1978 | Ikuta | 29/627 |
| 4,143,456 | 3/1979 | Inoue | 29/588 |
| 4,763,407 | 8/1988 | Abe | 29/840 |
| 4,819,041 | 4/1989 | Redmond | 357/80 |
| 4,843,225 | 6/1989 | Hoppe | 235/492 |
| 4,916,522 | 4/1990 | Cohn | 437/219 |
| 5,102,829 | 4/1992 | Cohn | 437/217 |
| 5,241,133 | 8/1993 | Mullen, III et al. | 257/787 |
| 5,258,647 | 11/1993 | Wojnarowski et al. | 257/687 |
| 5,285,352 | 2/1994 | Pastore et al. | 361/707 |
| 5,359,496 | 10/1994 | Kornrumpf et al. | 361/795 |
| 5,371,404 | 12/1994 | Juskey et al. | 257/659 |
| 5,420,460 | 5/1995 | Massingill | 257/693 |
| 5,455,456 | 10/1995 | Newman | |
| 5,557,142 | 9/1996 | Gilmore et al. | 257/659 |

FOREIGN PATENT DOCUMENTS

| | | |
|---|---|---|
| 0539075 | 4/1993 | European Pat. Off. |
| 2651923 | 3/1991 | France. |
| 2035701 | 6/1980 | United Kingdom. |

*Primary Examiner*—Olik Chaudhuri
*Assistant Examiner*—Alonzo Chambliss
*Attorney, Agent, or Firm*—Patricia A. Verlangieri

[57] ABSTRACT

A pad grid array plastic package includes a laminated plastic body with a centrally located cavity, an IC unit secured within the cavity, and an encapsulating organic polymer, such as epoxy, enclosing the cavity. The laminated body includes a substrate and a structural member on top of the substrate and having a centrally located aperture forming the cavity. The substrate is provided with metal patterns on both planar surfaces thereof, through-plated vias electrically connecting the metal patterns, and a grid array of contact pads on the bottom surface of the substrate, electrically connected to the metal pattern. The structural member provides strength and rigidity to the laminate and is sufficiently thick to enable protection of the IC unit when the cavity is enclosed with the encapsulating polymer. Also disclosed is a method of making the package and a laminate with the cavity, metal patterns and grid pad array for use in assembling the package.

9 Claims, 4 Drawing Sheets

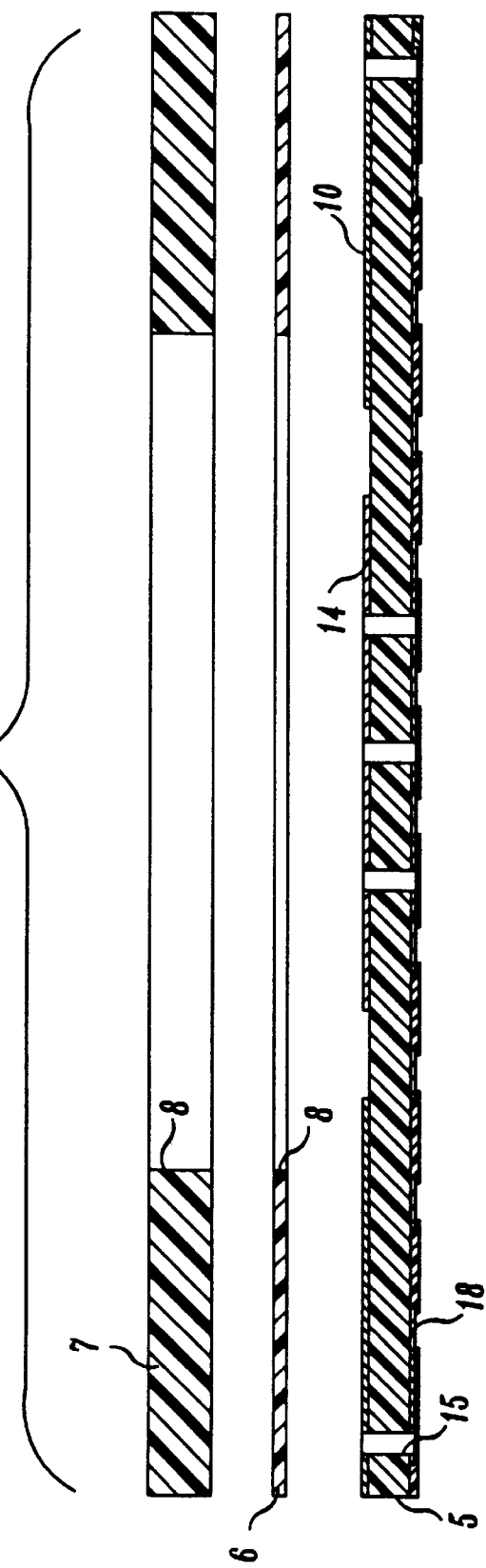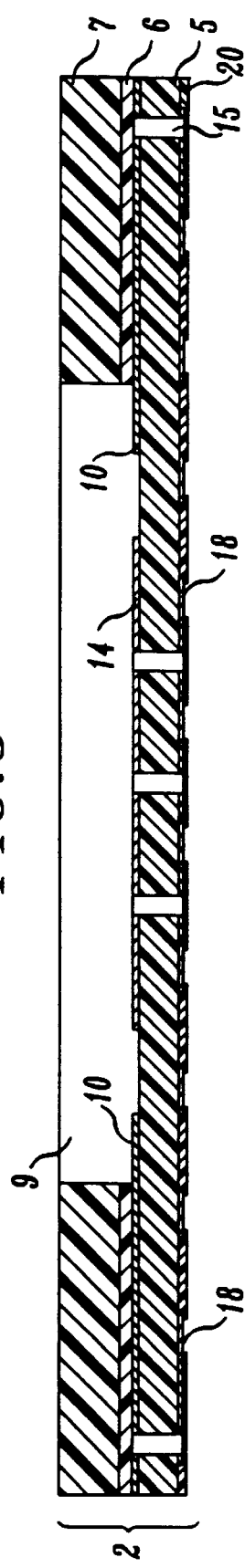

BALL GRID ARRAY PLASTIC PACKAGE

This is a division of application Ser. No. 08/180,248 filed Jan. 12, 1994, now abandoned.

TECHNICAL FIELD

This invention concerns manufacture of ball grid array plastic packages for electronic devices.

BACKGROUND OF THE INVENTION

Recently, William B. Mullen III disclosed in U.S. Pat. No. 5,241,133 a pad grid array plastic package. This package includes a resinous circuit carrying substrate having an array of contact pads on the bottom side and an IC unit electrically and mechanically mounted on the top side of the substrate. A protective plastic cover is transfer molded about the IC unit, covering most of the top side of the substrate. Solder balls are formed on the contact pads to provide a ball grid array that is to be soldered to a main circuit board.

However, this process utilizes transfer molding which, while widely used, has certain drawbacks. In transfer molding, the plastic material is forced under pressure through gates into a metal mold having recesses defining the shape of the cover to be produced. One of the main drawbacks of transfer molding is cost of and time delay in manufacturing metal molds. This becomes especially disadvantageous when there is a need for preparing molds for different sizes of packages or for accommodating a number of mold units in a single transfer scheme. There is also a possibility of damage caused by the liquefied thermoplastic material, to the wires electrically connecting the IC unit to the metallizations on the top side of the substrate. Another possibility is substrate deformation due to the shrinking of the plastic material in the process of curing.

Clearly, a need exists for a ball grid array plastic package which is simple to construct and produce on a mass production basis and which can be in-house assembled with the IC unit for fast prototyping.

SUMMARY OF THE INVENTION

A pad grid array plastic package includes a laminated plastic body with a centrally located cavity, an IC unit secured within the cavity, and an encapsulating organic polymer, such as epoxy, enclosing the cavity. The laminated body includes a substrate and a structural member on top of the substrate and having a centrally located aperture forming the cavity. The substrate is provided with metal patterns on both planar surfaces thereof, through-plated vias electrically connecting the metal patterns, and a grid array of contact pads on the bottom surface of the substrate, electrically connected to the metal pattern. The structural member provides strength and rigidity to the laminate and is sufficiently thick to enable protection of the IC unit when the cavity is enclosed with the encapsulating polymer. Also disclosed is a method of making the package with a laminate containing a cavity, metal patterns and grid pad array for use in assembling the package.

BRIEF DESCRIPTION OF THE DRAWINGS

FIG. 4 is an exploded cross-sectional view depicting components of a preassembly of the package prior to the laminating step; and FIG. 5 is a cross-sectional view of the components of the preassembly after the laminating step.

DETAILED DESCRIPTION OF THE INVENTION

Figure 1:
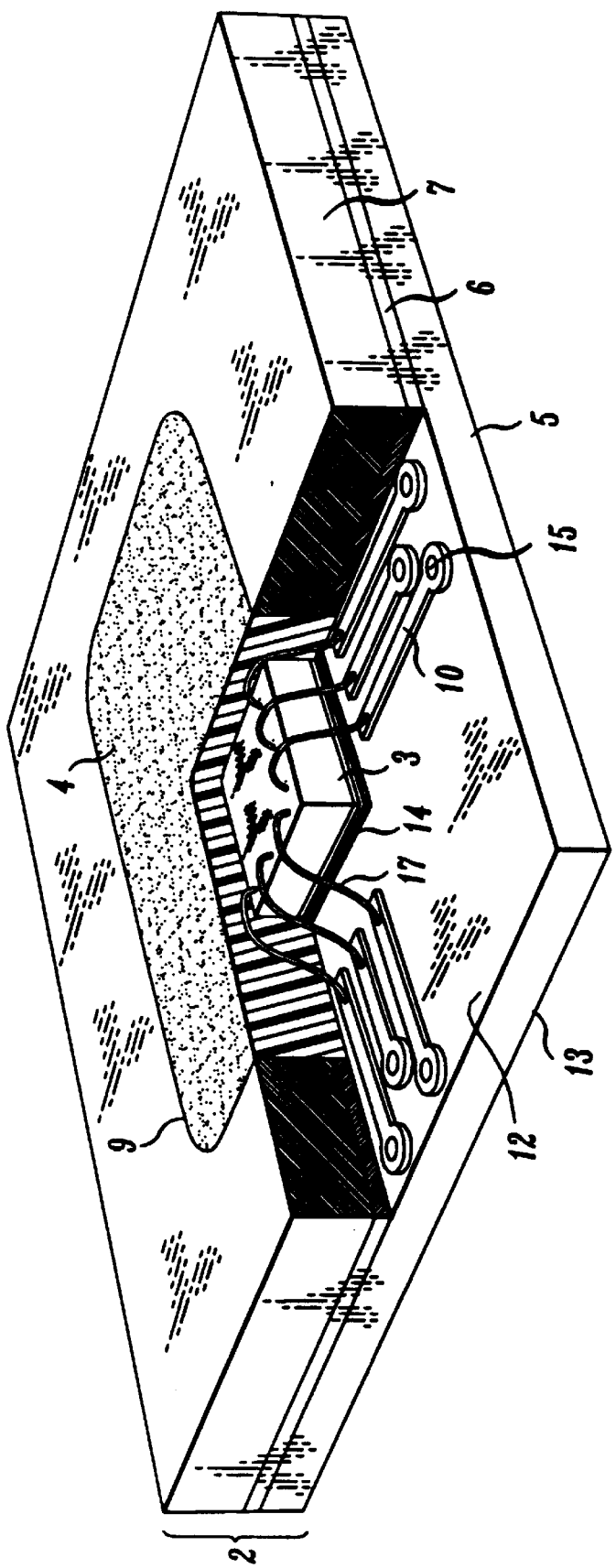
FIG. 1 is a perspective cut-away view of the plastic package.
Figure 2:
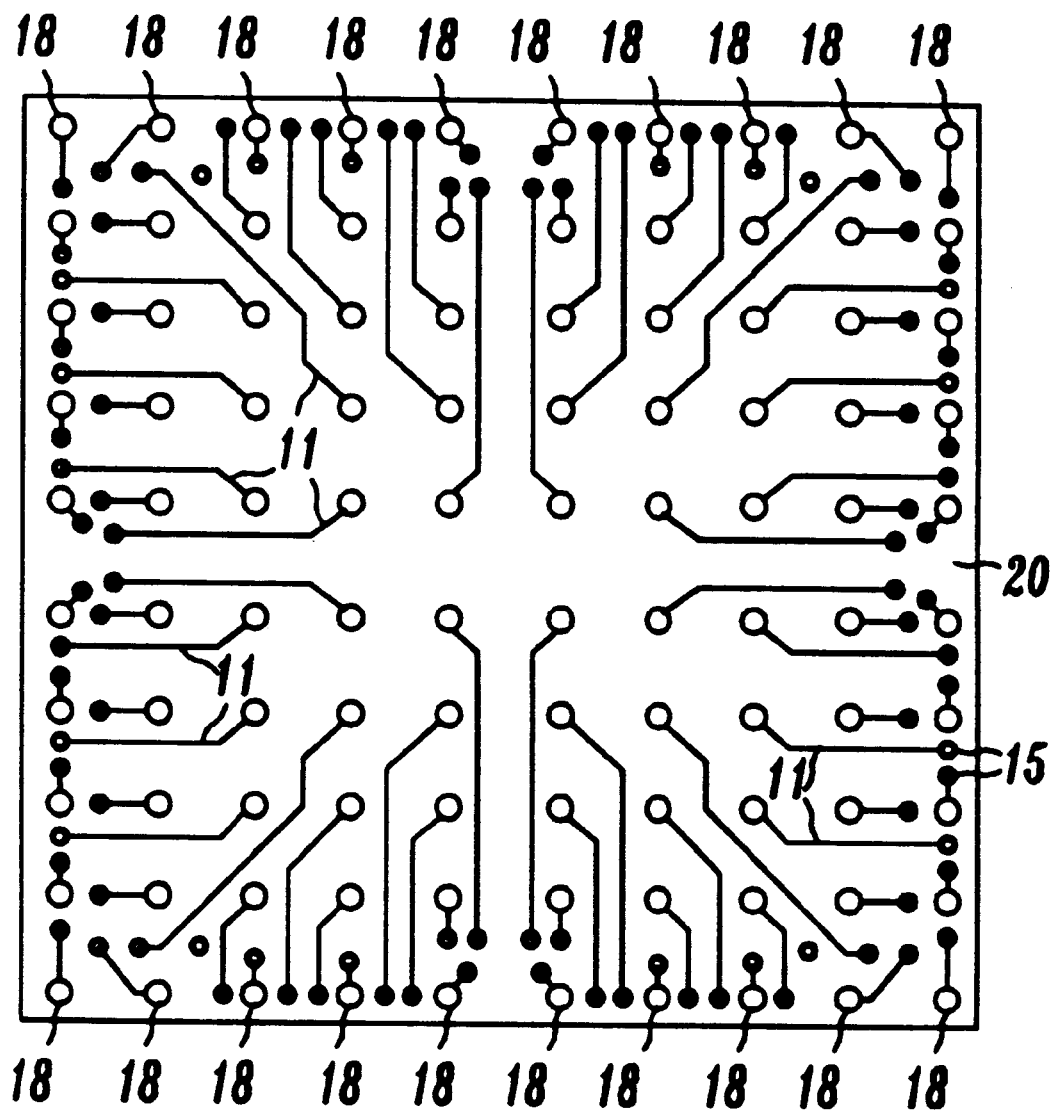
FIG. 2 is a schematic representation of a typical plan view of the bottom of the plastic package showing a pad grid array, metallizations and via holes.
Figure 3:
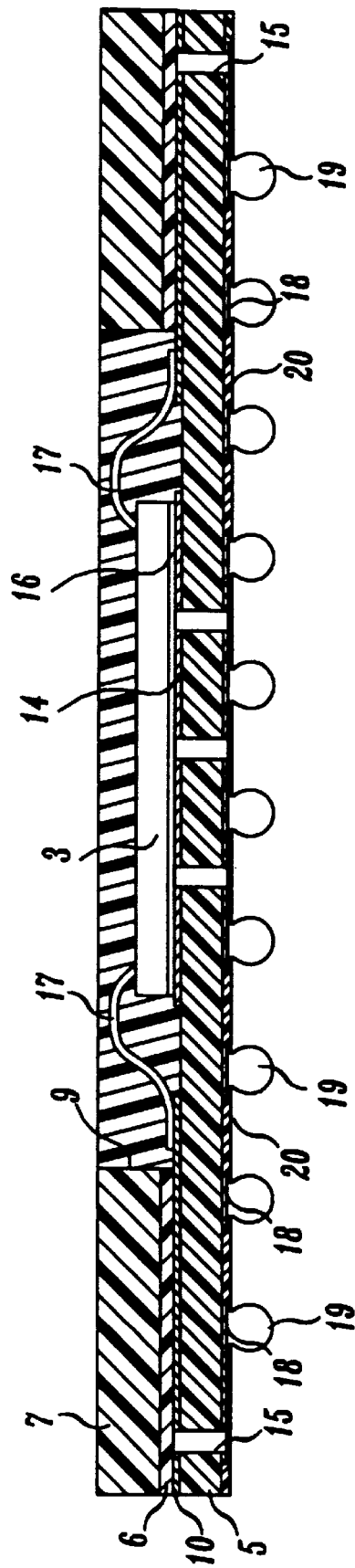
FIG. 3 is a cross-sectional side view of the complete package shown in FIG. 1.

In FIG. 1 is shown a perspective partial cut-away view of a complete Pad Grid Array Plastic Package, generally designated as 1. In FIG. 2 is shown the bottom view of package 1 and in FIG. 3 is shown a cross-sectional side view of the package. As is shown in FIG. 3, when the pads are provided with solder balls this becomes a Ball Grid Array Plastic Package. For illustration purposes, various dimensions in the drawings are not to scale.

Package 1 includes a laminate, 2, an IC unit, 3, and an encapsulant, 4. The laminate includes a plastic substrate, 5, a cured plastic prepreg, 6, and a plastic structural member, 7. The prepreg and the structural member are provided with an aperture, 8, forming with the substrate a cavity, 9. In this embodiment, substrate 5 is a double-sided substrate provided with metallizations 10 and 11, both on top and bottom surfaces 12 and 13, respectively, and a metal bonding pad, 14. However, for improved electrical performance, substrate 5 may contain additional metallization layers forming a multi-layer substrate as is well known in the art. The electrical connection between metallizations 10 on the top surface and metallizations 11 on the bottom surface of the substrate is provided by means of through-plated vias, 15. IC unit 3 is bonded within the cavity to the bonding pad. The IC unit is attached to the bonding pad by means of an adhesive, 16. The IC unit is electrically connected by means of gold wires, 17, to individual metallizations on the top surface of the substrate.

Structural member 7 covers the ends of metallizations 10 and vias 15, leaving uncovered only portions of metallizations 10 within the cavity. Encapsulant 4 encloses IC unit 3, wires 17 and those portions of metallizations 10 which are not covered by the structural member 7. The structural member provides strength and rigidity to the package and is thick enough to ensure complete coverage of wires 17 by encapsulant 4.

The bottom side of substrate 5, shown in FIG. 2, contains an array of contact pads, 18, arranged in a particular configuration. Contact pads 18 are connected by metallizations 11 to vias 15. The contact pads are typically circular but may assume other shapes. The contact pads serve to provide an electrical interconnection between the grid array package and a main circuit board (not shown). If the grid array package is to be soldered to the main circuit board, solder balls, 19, may be used on the contact pads. A solder mask, 20, is placed on the bottom surface 13 of the package leaving exposed contact pads 18. Solder mask 20 which is of a dielectric material covers the metallizations 11 and vias 15 to prevent deposition of solder on the metallizations where it is not needed.

An exemplary process of manufacturing the packages is described with reference to FIGS. 4 and 5 of the drawings. Sheets of materials to be bonded into a laminate are assembled into a preassembly, 21, shown in an exploded view depicted in FIG. 4. The sheets may be large enough to produce a multitude of packages in a single operation. The size of the sheets may be limited only by the size of the press used for laminating the preassembly into laminate 2.

Preassembly 21 includes substrate sheet 5, bonding sheet 6, and structural member sheet 7. Sheets 5 and 7 are of a typical "C"-stage printed wiring board (PWB) material. These sheets are typically of glass-reinforced epoxy. Bonding sheet 6 is of a "B"-stage or "prepreg" material. The B-stage is an intermediate stage in the reaction of a thermosetting resin in which the material softens when subjected to pressure and heat but does not entirely fuse. The B-stage material typically is of the same resin material as the C-stage material but only in a partially cured state.

Substrate sheet 5 is provided with metallization pattern including top and bottom metallizations 10 and 11, through-plated vias 15, and IC unit-bonding metallization pad 14. The bottom of the substrate sheet also includes contact pads 18 electrically connected to metallizations 11 (see FIG. 2). Both bonding sheet 6 and structural member sheet 7 are provided with aperture 8. The aperture is large enough to accommodate the IC unit and to expose a sufficient portion of ends of metallizations 10 to enable bonding of wires 17 thereto in a subsequent assembly operation.

Preassembly 21 of sheets 5, 6 and 7 is placed into a laminating press (not shown) wherein the preassembly is subjected to pressure and heat to laminate the sheets into a single laminate 2 shown in FIG. 5. If the sheets are of such an extent as to form a laminate with a plurality of recess cavities, the laminate may then be cut up into a corresponding plurality of single package units. In either case, each single package laminate unit is assembled with IC unit 3. The IC unit is attached to bonding pad 14 by an adhesive, 16. The adhesive may be conductive or non-conductive, depending on whether or not it is desirable to provide selected electrical connections between the IC unit and the bonding pad.

Typically, bonding pad 14 is used for bonding purposes only. In some other instances the bonding pad may be used also as a heat-sink to direct heat away from the IC unit or as a ground connection for the IC unit. In such other instances the bonding pad may be connected by means of the through-plated vias to contact pads on the bottom side of substrate 5.

The bonded IC unit is then electrically connected by means of wires 17 to metallizations 10 (see FIGS. 1 and 3). Cavity 9, including the IC unit, wires and portions of metallizations adjacent the IC unit, is then enclosed with a suitable encapsulating resin, such as epoxy, to seal the cavity from harsh environments and to protect the unit mechanically. This step includes placing a sufficient amount of a plastic encapsulant into the cavity to enclose the cavity, and permitting the encapsulant to cure.

The completed package is then ready for assembly to a main circuit board (not shown). The assembly may be accomplished in a known manner, e.g., by means of conductive adhesives or solder balls (bumps) 19 placed on contact pads 18 in a known manner forming a Ball Grid Array (BGA). An expedient way of providing contact pads 18 with solder bumps 19 is described in a copending application U.S. Ser. No. 08/128492 filed on Sep. 23, 1993 in the name of Y. Degani, T. D. Dudderar, and W. L. Woods, Jr., which is incorporated herein by reference.

Additional advantages and modifications will readily occur to those skilled in the art. Therefore, the invention in its broader aspects is not limited to the specific details, representative devices, and illustrated examples shown and described. Accordingly, various modifications may be made without departing from the spirit or scope of the general inventive concept as defined by the appended claims and their equivalents.

We claim:

1. The method of producing a pad grid array package comprising a laminated plastic body comprising a planar substrate and a planar structural member, a centrally recessed cavity formed on the structural member, a metal pattern on the top and bottom surfaces of the substrate, a grid array of contact pads on the bottom surface of the substrate connected to said metal pattern on said bottom surface, and conductive vias in the substrate connecting the metallic patterns on the opposite surfaces of the substrate, each of the vias being positioned away from said contact pads, an electronic device mounted within said cavity, a plurality of electrical leads from said electronic device to the metallic pattern on the top surface of the substrate, and an encapsulating polymer within the cavity sealing said electronic device, and said electrical leads and said inner portion of the metallic pattern on the top surface of the substrate, which comprises a) assembling into a preassembly a plurality of coextensive sheets to be laminated into a planar main body, said preassembly including a substrate sheet, a bonding sheet and a structural member sheet, said substrate sheet having a metallization pattern on its top surface, a grid array of contact pads on its bottom surface, a metallization pattern on said bottom surface connected to the grid array of contact pads, and through-plated vias interconnecting individual metallizations on said top surface to individual metallizations on said bottom surface, said structural member sheet and said bonding sheet having a centrally located aperture which is large enough to leave exposed upon assembly inner portions of the metallizations on the top surface of the substrate sheet;

b) subjecting the preassembly to heat and pressure so as to form a laminated body, the walls of the aperture in the structural member sheet and in the bonding sheet and the top surface of the substrate sheet forming a cavity;

c) bonding the electronic device to the top surface of the substrate within the cavity;

d) electrically connecting said electronic device to said inner portions of the metallization pattern on the top surface of the substrate sheet; and e) enclosing the cavity with a synthetic organic encapsulating polymer.

2. The method of claim 1 in which said top metallization pattern includes a metal bonding pad, wherein said electronic device is electrically and mechanically mounted on the bonding pad.

3. The method of claim 1, in which said substrate and said structural member sheets are of a C-stage synthetic organic polymer and said bonding sheet is of a B-stage synthetic organic polymer.

4. The method of claim 1, in which said synthetic organic encapsulating polymer comprises an epoxy.

5. The method of claim 1, in which the contact pads are provided with solder bumps forming a ball grid array for interconnection to other circuitry.

6. A method of producing a plastic laminate for use in fabricating a pad grid array plastic package comprising a) assembling into a preassembly a plurality of coextensive sheets to be laminated into a planar main body, said preassembly including a substrate sheet, a bonding sheet and a structural member sheet, said substrate sheet having a metallization pattern on its top surface, a grid array of contact pads on its bottom surface, a metallization pattern on said bottom surface connected to the grid array of contact pads, and through-plated vias interconnecting individual metallizations on said top surface to individual metallizations on said bottom surface, said structural member sheet and said bonding sheet having a centrally located aperture which is large enough to leave exposed upon assembly inner portions of the metallizations on the top surface of the substrate sheet; and b) subjecting the preassembly to heat and pressure so as to form a laminated body, the walls of the aperture in the structural member sheet and in the bonding sheet and the top surface of the substrate sheet forming a cavity.

7. The method of claim 6 in which said metallization pattern on the top surface of the substrate sheet includes a metal bonding pad, wherein said electronic device is electrically and mechanically mounted on the metal bonding pad.

8. The method of claim 6, in which said substrate and said structural member sheets are of a C-stage synthetic organic polymer and said bonding sheet is of a B-stage synthetic organic polymer.

9. The method of claim 8, in which said organic polymer comprises an epoxy.

\* \* \* \* \*